US011515687B2

(12) United States Patent
Tankhilevich et al.

(10) Patent No.: US 11,515,687 B2
(45) Date of Patent: *Nov. 29, 2022

(54) TUNABLE MULTILAYER TERAHERTZ MAGNON GENERATOR

(71) Applicant: Magtera, Inc., Walnut Creek, CA (US)

(72) Inventors: Boris G. Tankhilevich, Walnut Creek, CA (US); Nicholas J. Kirchner, Gilroy, CA (US); Charles Thomas Thurman, Livermore, CA (US)

(73) Assignee: Magtera, Inc., Walnut Creek, CA (US)

( * ) Notice: Subject to any disclaimer, the term of this patent is extended or adjusted under 35 U.S.C. 154(b) by 108 days.

This patent is subject to a terminal disclaimer.

(21) Appl. No.: 16/927,286

(22) Filed: Jul. 13, 2020

(65) Prior Publication Data

US 2020/0343693 A1    Oct. 29, 2020

Related U.S. Application Data

(63) Continuation of application No. 16/245,224, filed on Jan. 10, 2019, now Pat. No. 10,892,602.

(51) Int. Cl.
*H01S 5/062* (2006.01)
*H01S 5/02* (2006.01)
(Continued)

(52) U.S. Cl.
CPC ....... *H01S 5/3402* (2013.01); *H01F 10/3254* (2013.01); *H01F 10/3268* (2013.01); *H01F 41/32* (2013.01); *H01S 5/021* (2013.01); *H01S 5/0208* (2013.01); *H01S 5/0213* (2013.01); *H01S 5/0218* (2013.01); *H01S 5/04252* (2019.08); *H01S 5/0622* (2013.01)

(58) Field of Classification Search
CPC .. H01S 5/04252; H01S 5/0208; H01S 5/3402; H01S 5/0218; H01S 5/0622; H01F 41/32; H01F 10/3254; H03K 19/0944
USPC ................................. 372/4; 359/342; 326/49
See application file for complete search history.

(56) References Cited

U.S. PATENT DOCUMENTS 7,430,074 B2    9/2008   Korenblit et al.
7,508,578 B2    3/2009   Korenblit et al.
(Continued)

OTHER PUBLICATIONS

International Preliminary Report on Patentability received for PCT Application Serial No. PCT/US2020/012985 dated Jul. 22, 2021, 12 pages.

(Continued)

*Primary Examiner* — Tuan N Nguyen
(74) *Attorney, Agent, or Firm* — Amin, Turocy & Watson, LLP

(57) ABSTRACT

A method for tuning the frequency of THz radiation is provided. The method utilizes an apparatus comprising a spin injector, a tunnel junction coupled to the spin injector, and a ferromagnetic material coupled to the tunnel junction. The ferromagnetic material comprises a Magnon Gain Medium (MGM). The method comprises the step of applying a bias voltage to shift a Fermi level of the spin injector with respect to the Fermi level of the ferromagnetic material to initiate generation of non-equilibrium magnons by injecting minority electrons into the Magnon Gain Medium. The method further comprises the step of tuning a frequency of the generated THz radiation by changing the value of the bias voltage.

20 Claims, 5 Drawing Sheets

Cross Sectional View
Terahertz Magnon Laser with RKKY Pinning Layer

(51) Int. Cl.
  *H01F 10/32* (2006.01)
  *H01S 5/042* (2006.01)
  *H01F 41/32* (2006.01)
  *H01S 5/34* (2006.01)

(56) References Cited

U.S. PATENT DOCUMENTS

| | | | |
|---|---|---|---|
| 7,982,946 B1 | 7/2011 | Korenblit et al. | |
| 8,031,397 B1 | 10/2011 | Korenblit et al. | |
| 9,132,451 B1 | 9/2015 | Tankhilevich | |
| 9,136,665 B1 | 9/2015 | Tankhilevich et al. | |
| 9,418,648 B1 * | 8/2016 | Tankhilevich | B06B 1/04 |
| 2006/0118839 A1 | 6/2006 | Sugahara et al. | |
| 2009/0190264 A1 | 7/2009 | Fukuzawa et al. | |
| 2010/0033878 A1 | 2/2010 | Tsunekawa et al. | |
| 2012/0091548 A1 | 4/2012 | Sukegawa et al. | |
| 2012/0112299 A1 | 5/2012 | Inomata et al. | |
| 2015/0129946 A1 | 5/2015 | Annunziata et al. | |
| 2015/0162525 A1 | 6/2015 | Park et al. | |

OTHER PUBLICATIONS

International Preliminary Report on Patentability received for PCT Application Serial No. PCT/US2020/012229 dated Jul. 22, 2021, 13 pages.
International Preliminary Report on Patentability received for PCT Application Serial No. PCT/US2020/012982 dated Jul. 22, 2021, 11 pages.
Examination Report received for Indian Patent Application Serial No. 202117035863 dated Mar. 29, 2022, 6 pages.
Non-Final Office Action received for U.S. Appl. No. 17/002,475 dated Apr. 25, 2022, 43 pages.
Notice of Allowance received for U.S. Appl. No. 16/245,224 dated Apr. 14, 2020, 27 pages.
Notice of Allowance received for U.S. Appl. No. 16/704,090 dated May 26, 2020, 35 pages.
Notice of Allowance received for U.S. Appl. No. 16/245,247 dated May 27, 2020, 29 pages.
International Search Report and Written Opinion received for PCT Application Serial No. PCT/US2020/012985 dated Apr. 2, 2020, 18 pages.
Vilkov et al., "Generation of Terahertz Radiation Spectra by Radiation Sources Based on Solid-State Micro-and Nanostructures and Detection of Terahertz Spectra", DOI: 10.1134/S106422691809022X, Sep. 28, 2018, pp. 1015-1026.
Sulymenko et al., "Terahertz-Frequency Signal Source Based on an Antiferromagnetic Tunnel Junction", DOI: 10.1109/LMAG.2018.2852291, Jul. 2, 2018, 5 pages.
Gulyaev et al., "Generation of Terahertz Radiation in Magnetic Junctions based on Nanowires." DOI: 10.1134/S1063785019030271, May 6, 2019, pp. 271-273.
International Search Report and Written Opinion received for PCT Application Serial No. PCT/US2020/012229 dated Apr. 7, 2020, 19 pages.
International Search Report and Written Opinion received for PCT Application Serial No. PCT/US2020/012982 dated Apr. 20, 2020, 17 pages.

* cited by examiner

Cross Sectional View
Terahertz Magnon Laser with RKKY Pinning Layer

Electron spectrum and generation of magnons in half-metals. The Fermi level $\varepsilon_F$ lies inside the exchange gap, $\Delta$ of the minority electrons. The generation of magnons is similar to the process in semiconductors. $\delta E$ is the energy the electron transmits to the Fermi electrons immediately after emitting a magnon.

TUNABLE MULTILAYER TERAHERTZ MAGNON GENERATOR

CROSS REFERENCE TO RELATED APPLICATION

This application is a continuation of, and claims priority to, U.S. patent application Ser. No. 16/245,224 titled "TUNABLE MULTILAYER TERAHERTZ MAGNON GENERATOR" and filed on Jan. 10, 2019. The entirety of the foregoing application listed herein is hereby incorporated by reference.

TECHNICAL FIELD

The current invention relates to the field of magnon lasers employed to generate terahertz radiation.

BACKGROUND ART

Terahertz (THz) radiation, an electromagnetic radiation in a frequency interval from 0.1 THz to 30 THz, occupies the portion of the electromagnetic spectrum between the microwave band and the infrared band.

A THz photon has an energy that is less than the energy of an optical photon. That is why THz-waves can penetrate deep into the substance where the optical waves cannot penetrate. At THz frequencies, the molecules vibrate. That is why THz waves are useful in the study of molecules.

Indeed, the unique rotational and vibrational responses of molecules within the THz range provide information that is generally absent in optical, X-ray and NMR images. A THz wave can easily penetrate and inspect the insides of most dielectric materials, which are opaque to visible light and low contrast to X-rays, making THz waves a useful complementary imaging source.

For example, THz waves maintain reasonable penetration depth in certain common materials, such as clothes, plastic, wood, sand and soil. Therefore, THz technology has the potential to detect explosives packaged or buried within these materials because the explosives have unique THz spectral properties when compared to the surrounding materials. The spectral fingerprints of explosive materials can be expected in the THz band, and THz imaging can be applied for landmine detection. However, at present, efficient, compact, solid-state sources for the spectral range 0.1-30 THz are still lacking.

Indeed, broadband pulsed THz sources are usually based on the excitation of different materials with ultra-short laser pulses. Several different mechanisms have been exploited to generate THz radiation, including photo carrier acceleration in photo conducting antennas, second-order non-linear effects in electro-optic crystals etc.

For narrowband THz sources, solid-state lasers are often considered. They are based on inter-band transitions in narrow gap semiconductors or on inter sub band transitions, i.e. transitions in quantum confined structures, e.g. nanostructures, between confined conduction or valence states. To get THz radiation from direct inter band transitions, near zero gap semiconductors are required. For inter sub band transitions conventional wide gap materials can be used, but require precise complicated structures. At present the construction of multiple quantum-well semiconductor structures for laser emission is feasible.

The quantum cascade consists of a repeating structure, in which each repeating unit is made up of an injector and an active region. In the active region, a population inversion exists and electron transition to a lower energy level occurs, emitting photons at a specific wavelength. Kohler et al. (R. Kohler et al., Nature 417, 156 (2002)) designed a THz quantum cascade laser operating at 4.4 THz. The laser consisted of a total over 700 quantum wells, and demonstrated pulse operation at temperature of 10 K. For a review, please see, e.g., B Ferguson and X.-C. Zhang, Nat. Matter, 26 (2002).

The latest progress in QCL generators was reported by Manijeh Razeghi, et al. in Photonics Spectra, December, 48-51 (2016). The authors used nonlinear mixing of two QCL. However, the usage of nonlinear mixers invites the inherent limitations. Indeed, the nonlinear QCL mixers are very complicated devices (each such QCL comprising multiple barrier layers and multiple well layers that should be fabricated with the accuracy up to 0.1 nm), have low output power in continuous regime (these devices reach the power output up to 0.5 milliwatt only in pulsed regime); and have very limited tunability in the region of between (2-4.45) THz.

AdTech Optics located in the City of Industry, Calif., has been developing and producing innovative QC lasers since 2005. AdTech's QCLs are designed to cover most of the mid-infrared spectral range, from $\lambda=3.8$ μm (78 THz) to $\lambda=12.5$ μm (23.9 THz), Almost all of AdTech's QCLs operate continuously at room temperature and can be designed to work at a single frequency by use of distributed-feedback waveguide fabrication. However, AdTech's QCLs are only mechanically tunable which makes those QCL unpractical for the majority of applications including the spectrometric, communication, etc., to name just a few applications.

SUMMARY

This Summary is provided to introduce a selection of concepts that are further described below in the Detailed Description. This Summary is not intended to identify key or essential features of the claimed subject matter, nor is it intended to be used as an aid in determining the scope of the claimed subject matter.

A method for tuning the frequency of Terahertz radiation by using a tunable multilayer terahertz magnon generator is provided.

The tunable multilayer terahertz magnon generator comprises a top electrode, a pinning layer coupled to the top electrode, a spin injector coupled to the top electrode via the pinning layer, a tunnel junction coupled to the spin injector, a bottom layer comprising a ferromagnetic material coupled to the tunnel junction, the ferromagnetic material further comprising Magnon Gain Medium, a bottom electrode coupled to the bottom electrode, and a substrate coupled to the bottom electrode.

The method for tuning the frequency of Terahertz radiation by using the tunable multilayer terahertz magnon generator comprises applying a bias voltage to shift a Fermi level of the spin injector with respect to a Fermi level of the ferromagnetic material to initiate generation of non-equilibrium magnons by injecting minority electrons into the Magnon Gain Medium; wherein injected minority electrons pass into high energy electronic states in a lower sub band with spin up of the ferromagnetic material by flipping their spin during exchange process; and wherein non-equilibrium magnons are generated during this process; and wherein interaction between the non-equilibrium magnons causes generation of the electromagnetic radiation.

The method for tuning the frequency of Terahertz radiation by using the tunable multilayer terahertz magnon generator further comprises: tuning a frequency of the generated Terahertz radiation by changing a value of the bias voltage.

DESCRIPTION OF THE DRAWINGS

The accompanying drawings, which are incorporated in and form a part of this specification, illustrate embodiments of the technology and, together with the description, explain the principles below.

DETAILED DESCRIPTION

Reference now be made in detail to the embodiments of the technology, examples of which are illustrated in the accompanying drawings. While the present technology will be described in conjunction with the various embodiments, it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following detailed description, numerous specific-details are set forth in order to provide a thorough understanding of the presented embodiments. However, it will be obvious to one of ordinary skill in the art that the presented embodiments may be practiced without these specific details. In other instances, well known methods, procedures, components, and circuits have not been described in detail as not to unnecessarily obscure aspects of the presented embodiments.

Figure 1:
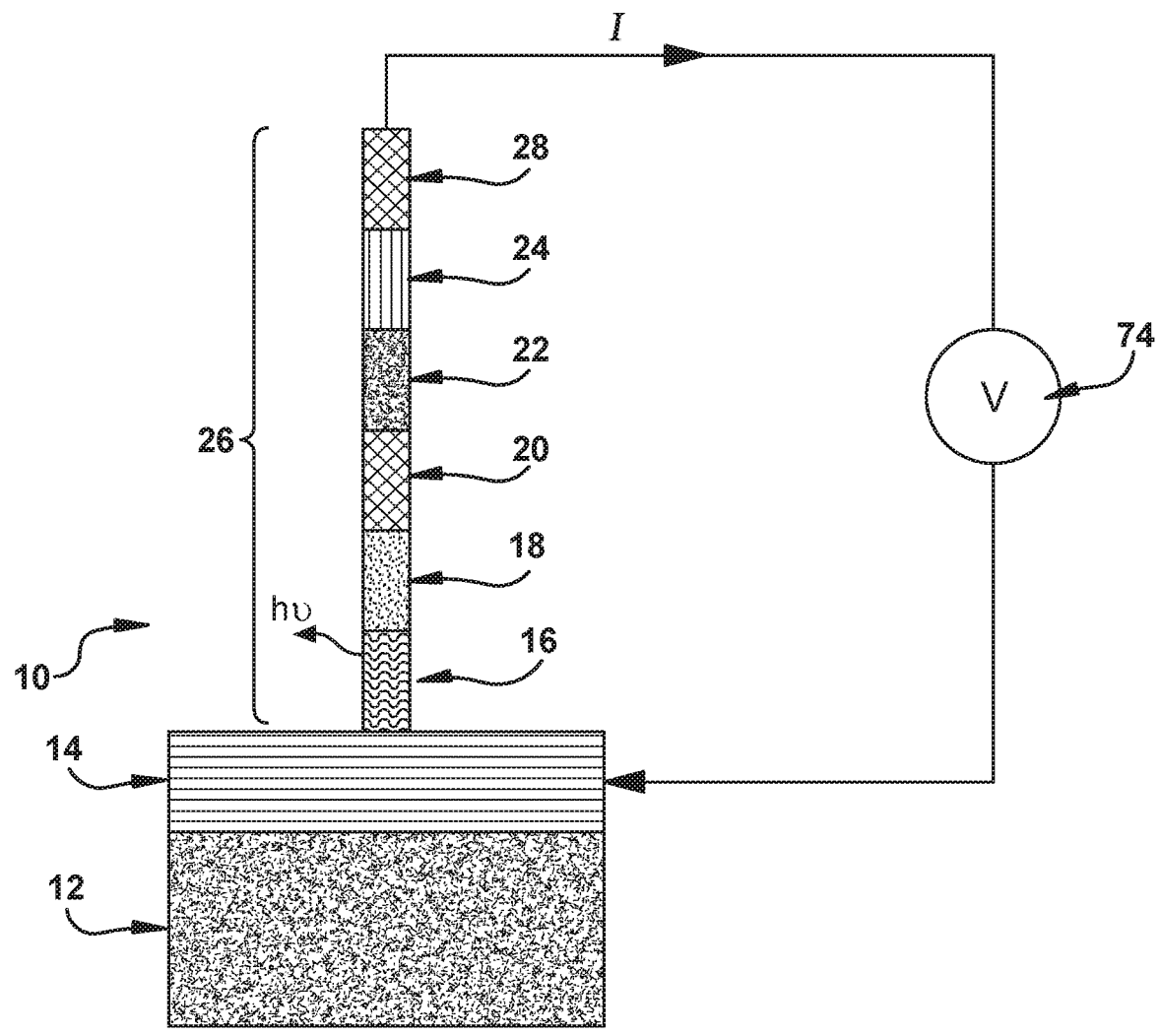
FIG. 1 depicts a cross-sectional view of a tunable multilayer terahertz magnon laser with RUDERMAN-KITTEL-KASUYA-YOSIDA (RKKY) pinning layer comprising a substrate, a bottom electrode, bottom layer, a tunnel junction, a top layer, a pinning layer, a reference layer and a top electrode for the purposes of the present technology.

In an embodiment of the present technology, FIG. 1 depicts a cross-sectional view of a tunable multilayer terahertz magnon laser 10 with RUDERMAN-KITTEL-KASUYA-YOSIDA (RKKY) pinning layer comprising a substrate 12, a bottom electrode 14, bottom layer 16, a tunnel junction 18, a top layer 20, a pinning layer 22, a reference layer 24 and a top electrode 28 for the purposes of the present technology. A single multilayer column 26 comprises the layers 16-28.

In an embodiment of the present technology, the substrate 12 (of FIG. 1) comprises gallium arsenide (GaAs).

Gallium arsenide(GaAs) is a compound of the elements gallium and arsenic. It is a III-V direct bandgap semiconductor with a zinc blende crystal structure. Gallium arsenide is used in the manufacture of monolithic microwave integrated circuits.

GaAs is often used as a substrate material for the epitaxial growth of other III-V semiconductors including: Indium gallium arsenide, aluminum gallium arsenide and others.

GaAs can be fabricated by using molecular beam epitaxy (MBE). Molecular beam epitaxy takes place in high vacuum or ultra-high vacuum ($10^{-8}$-$10^{-12}$) Torr.

The most important aspect of MBE is the deposition rate (typically less than 3,000 nm per hour) that allows the films to grow epitaxially. These deposition rates require proportionally better vacuum to achieve the same impurity levels as other deposition techniques. The absence of carrier gases as well as the ultra-high vacuum environment result in the highest achievable purity of the grown films.

In solid source MBE, elements such as gallium and arsenic, in ultra-pure form, are heated in separate quasi-Knudsen effusion cells or electron beam evaporators until they begin to slowly sublime. The gaseous elements then condense on the wafer, where they may react with each other. In the example of gallium and arsenic, single-crystal gallium arsenide is formed. When evaporation sources such as copper or gold are used, the gaseous elements impinging on the surface may be adsorbed (after a time window where the impinging atoms will hop around the surface) or reflected. Atoms on the surface may also desorb.

Controlling the temperature of the source will control the rate of material impinging on the substrate surface and the temperature of the substrate will affect the rate of hopping or desorption. The term "beam" means that evaporated atoms do not interact with each other or vacuum chamber gases until they reach the wafer, due to the long mean free paths of the atoms.

In an embodiment of the present technology, the substrate 12 (of FIG. 1) comprises aluminum oxide ($Al_2O_3$).

In an embodiment of the present technology, the substrate 12 (of FIG. 1) comprises aluminum nitride (AlN).

In an embodiment of the present technology, the substrate 12 (of FIG. 1) comprises indium-tin-oxide (InTnO).

Indium tin oxide (ITO) is a ternary composition of indium, tin and oxygen in varying proportions. Depending on the oxygen content, it can either be described as a ceramic or alloy. Indium tin oxide is typically encountered as an oxygen-saturated composition with a formulation of 74% In, 18% $O_2$, and 8% Sn by weight. Oxygen-saturated compositions are so typical, that unsaturated compositions are termed oxygen-deficient ITO. It is transparent and colorless in thin layers, while in bulk form it is yellowish to grey. In the infrared region of the spectrum it acts as a metal-like mirror.

Indium tin oxide is one of the most widely used transparent conducting oxides because of its two main properties: its electrical conductivity and optical transparency, as well as the ease with which it can be deposited as a thin film. As with all transparent conducting films, a compromise must be made between conductivity and transparency, since increasing the thickness and increasing the concentration of charge carriers increases the material's conductivity, but decreases its transparency. Thin films of indium tin oxide are most commonly deposited on surfaces by physical vapor deposition. Often used is electron beam evaporation, or a range of sputter deposition techniques.

In an embodiment of the present technology, the substrate 12 (of FIG. 1) comprises silicon (Si).

Silicon is a chemical element with symbol Si and atomic number 14. A hard and brittle crystalline solid with a blue-gray metallic luster, it is a tetravalent metalloid. It is a member of group 14 in the periodic table, along with carbon above it and germanium, tin, lead, and flerovium below. It is rather unreactive, though less so than germanium, and has great chemical affinity for oxygen; as such, it was first prepared and characterized in pure form only in 1823 by Jöns Jakob Berzelius.

Silicon is the eighth most common element in the universe by mass, but very rarely occurs as the pure element in the Earth's crust. It is most widely distributed in dusts, sands, planetoids, and planets as various forms of silicon dioxide (silica) or silicates. Over 90% of the Earth's crust is composed of silicate minerals, making silicon the second most abundant element in the Earth's crust (about 28% by mass) after oxygen. A very highly purified silicon is used in integrated circuits.

In an embodiment of the present technology, the substrate 12 (of FIG. 1) comprises silicone on sapphire (SoS).

Silicon on sapphire (SOS) is a hetero-epitaxial process for integrated circuit manufacturing that consists of a thin layer (typically thinner than 0.6 μm) of silicon grown on a sapphire ($Al_2O_3$) wafer.

SOS is part of the Silicon on Insulator (SOI) family of CMOS technologies. Typically, high-purity artificially grown sapphire crystals are used. The silicon is usually deposited by the decomposition of silane gas (SiH4) on heated sapphire substrates. The advantage of sapphire is that it is an excellent electrical insulator, preventing stray currents caused by radiation from spreading to nearby circuit elements. SOS faced early challenges in commercial manufacturing because of difficulties in fabricating the very small transistors used in modern high-density applications. This is because the SOS process results in the formation of dislocations, twinning and stacking faults from crystal lattice disparities between the sapphire and silicon. Additionally, there is some aluminum, a p-type dopant, contamination from the substrate in the silicon closest to the interface.

The application of epitaxial growth of silicon on sapphire substrates for fabricating MOS devices involves a silicon purification process that mitigates crystal defects which result from a mismatch between sapphire and silicon lattices. For example, Peregrine Semiconductor's SP4T switch is formed on an SOS substrate where the final thickness of silicon is approximately 95 nm. Silicon is recessed in regions outside the polysilicon gate stack by poly oxidation and further recessed by the sidewall spacer formation process to a thickness of approximately 78 nm.

In an embodiment of the present technology, the substrate 12 (of FIG. 1) comprises and magnesium oxide (MgO).

Magnesium oxide (MgO), or magnesia, is a white hygroscopic solid mineral that occurs naturally as periclase and is a source of magnesium. It has an empirical formula of MgO and consists of a lattice of $Mg_2$ (+ions) and $O_2$ (−ions) held together by ionic bonding. Magnesium hydroxide forms in the presence of water ($MgO+H_2O \rightarrow Mg(OH)_2$), but it can be reversed by heating it to separate moisture.

Magnesium oxide was historically known as magnesia alba (literally, the white mineral from magnesia—other sources give magnesia alba as $MgCO_3$), to differentiate it from magnesia negra, a black mineral containing what is now known as manganese. While "magnesium oxide" normally refers to MgO, magnesium peroxide $MgO_2$ is also known as a compound. Per evolutionary crystal structure prediction, $MgO_2$ is thermodynamically stable at pressures above 116 GPa (gigapascals), and a totally new semiconducting suboxide $Mg_3O_2$ is thermodynamically stable above 500 GPa. Because of its stability, MgO is used as a model system for investigating vibrational properties of crystals. Magnesium oxide is produced by the calcination of magnesium carbonate or magnesium hydroxide.

In an embodiment of the present technology, referring still to FIG. 1, the bottom electrode 14 is selected from the group of materials consisting of: cobalt iron alloy ($Co_{0.5}$ $Fe_{0.5}$); silver (Ag); gold (Au); platinum (Pt); cobalt (Co); palladium (Pd); titanium (Ti); and titanium tungsten (TiW).

Each of these materials can be deposited on a substrate by either Molecular beam epitaxy (MBE) (please, see the discussion above), or by sputter deposition.

Sputter deposition is a physical vapor deposition (PVD) method of thin film deposition by sputtering. This involves ejecting material from a "target" that is a source onto a "substrate" such as a silicon wafer. Re-sputtering is re-emission of the deposited material during the deposition process by ion or atom bombardment. Sputtered atoms ejected from the target have a wide energy distribution, typically up to tens of eV (100,000 K). The sputtered ions (typically only a small fraction of the ejected particles is ionized—on the order of 1%) can ballistically fly from the target in straight lines and impact energetically on the substrates or vacuum chamber (causing re-sputtering).

Alternatively, at higher gas pressures, the ions collide with the gas atoms that act as a moderator and move diffusively, reaching the substrates or vacuum chamber wall and condensing after undergoing a random walk. The entire range from high-energy ballistic impact to low-energy thermalized motion is accessible by changing the background gas pressure.

The sputtering gas is often an inert gas such as argon. For efficient momentum transfer, the atomic weight of the sputtering gas should be close to the atomic weight of the target, so for sputtering light elements neon is preferable, while for heavy elements krypton or xenon are used. Reactive gases can also be used to sputter compounds. The compound can be formed on the target surface, in-flight or on the substrate depending on the process parameters. The availability of many parameters that control sputter deposition make it a complex process, but also allow experts a large degree of control over the growth and microstructure of the film.

An important advantage of sputter deposition is that even materials with very high melting points are easily sputtered while evaporation of these materials in a resistance evaporator or Knudsen cell is problematic or impossible. Sputter deposited films have a composition close to that of the source material. The difference is due to different elements spreading differently because of their different mass (light elements are deflected more easily by the gas) but this difference is constant.

Sputtered films typically have a better adhesion on the substrate than evaporated films. A target contains a large amount of material and is maintenance free making the technique suited for ultrahigh vacuum applications.

Sputtering sources contain no hot parts (to avoid heating they are typically water cooled) and are compatible with reactive gases such as oxygen. Sputtering can be performed top-down while evaporation must be performed bottom-up. Advanced processes such as epitaxial growth is possible.

Some disadvantages of the sputtering process are that the process is more difficult to combine with a lift-off for structuring the film. This is because the diffuse transport, characteristic of sputtering, makes a full shadow impossible. Thus, one cannot fully restrict where the atoms go, which can lead to contamination problems. Also, active control for layer-by-layer growth is difficult compared to pulsed laser deposition and inert sputtering gases are built into the growing film as impurities.

Pulsed laser deposition is a variant of the sputtering deposition technique in which a laser beam is used for sputtering. Role of the sputtered and re-sputtered ions and the background gas is fully investigated during the pulsed laser deposition process.

Sputtering sources often employ magnetrons that utilize strong electric and magnetic fields to confine charged plasma particles close to the surface of the sputter target. In a magnetic field, electrons follow helical paths around magnetic field lines, undergoing more ionizing collisions with gaseous neutrals near the target surface than would otherwise occur. (As the target material is depleted, a "racetrack" erosion profile may appear on the surface of the target.)

The sputter gas is typically an inert gas such as argon. The extra argon ions created because of these collisions lead to a higher deposition rate. The plasma can also be sustained at a lower pressure this way. The sputtered atoms are neutrally charged and so are unaffected by the magnetic trap.

Charge build-up on insulating targets can be avoided with the use of RF sputtering where the sign of the anode-cathode bias is varied at a high rate (commonly 13.56 MHz). RF sputtering works well to produce highly insulating oxide films but with the added expense of RF power supplies and impedance matching networks. Stray magnetic fields leaking from ferromagnetic targets also disturb the sputtering process. Specially designed sputter guns with unusually strong permanent magnets must often be used in compensation.

In an embodiment of the present technology, referring still to FIG. 1, the bottom layer 16 is selected from the group of materials consisting of: chromium dioxide ($CrO_2$); half-metallic ferromagnetic oxide $Sr_2FeMoO_6$; Heusler alloy $Co_2MnGe$; Heusler alloy $Co_2MnSi$ (CMS); Heusler alloy $Co_2FeSi$ (CFS); Heusler alloy $Co_2MnSn$ (CMS); and Heusler alloy $Co_2FeAl_{0.5}Si_{0.5}$ (CFAS).

Example I

For example, in the paper published recently in *Nat Commun.*, 2014 May 30; 5: 3974. "*Direct observation of half-metallicity in the Heusler compound Co2MnSi*" by M. Jourdan et al., $Co_2MnSi$ samples were prepared and investigated completely in situ in an ultrahigh vacuum cluster consisting of sputtering chambers, an molecular beam epitaxy (MBE) chamber, and a Synchrotron radiation ultraviolet photoemission spectroscopy (SRUPS) chamber equipped with a He gas discharge lamp (hv=21.2 eV) and a hemispherical energy analyzer with multi-channel spin filter (energy resolution ≅400 meV, Sherman function S=0.42±0.05). First, an epitaxial buffer layer of the Heusler compound Co2MnGa (30 nm) was grown on the MgO(100) substrate by radio frequency (RF)-sputtering at room temperature. By an optimized additional annealing process at 550° C. L21 order was obtained as shown by high energy electron diffraction (RHEED) and X-ray diffraction (XRD). Co2MnSi (70 nm) was RF-sputtered on top at room temperature. Induced by the buffer layer the Co2MnSi thin films showed already some degree of $L2_1$ surface order as deposited. By additional annealing the order was improved as was demonstrated for the film surface by RHEED.

In an embodiment of the present technology, referring still to FIG. 1, the tunnel junction 18 is selected from the group of materials consisting of: magnesium oxide (MgO); aluminum oxide ($Al_2O_3$); and spinel $MgAl_2O_4$.

Example II

In the paper "*Low-temperature atomic layer deposition of MgO thin films on Si*" by S Vangelista et al., published in *Journal of Physics D: Applied Physics, Volume 46, Number 48*, Magnesium oxide (MgO) films have been grown by atomic layer deposition in the wide deposition temperature window of 80-350° C. by using bis (cyclopentadienyl) magnesium and $H_2O$ precursors. MgO thin films were deposited on both HF-last Si (100) and $SiO_2$/Si substrates at a constant growth rate of ~0.12 nm cycle$^{-1}$. The structural, morphological and chemical properties of the synthesized MgO thin films were investigated by x-ray reflectivity, grazing incidence x-ray diffraction, time-of-flight secondary ion mass spectrometry and atomic force microscopy measurements. MgO layers were characterized by sharp interface with the substrate and limited surface roughness, besides good chemical uniformity and polycrystalline structure for thickness above 7 nm. CV measurements were performed on Al/MgO/Si MOS capacitors, with MgO in the (4.6-11) nm thickness range, which allowed determining a dielectric constant (κ)~11. Co layers were grown by chemical vapor deposition in direct contact with MgO without vacuum-break (base pressure $10^{-5}$-$10^{-6}$ Pa). The as-grown Co/MgO stacks showed sharp interfaces and no elements inter diffusion among layers. C-V and I-V measurements have been conducted on Co/MgO/Si MOS capacitors. The dielectric properties of MgO were not influenced by the further process of Co deposition.

In an embodiment of the present technology, referring still to FIG. 1, the spin injector is selected from the group of materials consisting of: chromium dioxide ($CrO_2$); half-metallic ferromagnetic oxide $Sr_2FeMoO_6$; Heusler alloy $Co_2MnGe$; Heusler alloy $Co_2MnSi$ (CMS); Heusler alloy $Co_2FeSi$ (CFS); Heusler alloy $Co_2MnSn$; and Heusler alloy $Co_2FeAl_{0.5}Si_{0.5}$(CFAS).

Example III

In the paper "Structural and magnetic properties and tunnel magnetoresistance for $Co_2$(Cr,Fe)Al and $Co_2FeSi$ full-Heusler alloys" by K Inomata. et al., published in *Journal of Physics D: Applied Physics, Volume 39, Number 5*, the structure and magnetization of $Co_2(Cr_{1-x}Fe_x)Al$ (0≤x≤1) and $Co_2FeSi$ full-Heusler alloy have been investigated. The films were deposited on thermally oxidized Si ($SiO_2$) and MgO (001) single crystal substrates by ultra-high vacuum sputtering at various temperatures. The films were also post-annealed after deposition at room temperature (RT). Magnetic tunnel junctions with a full-Huesler alloy electrode were fabricated with a stacking structure of $Co_2$YZ (20 nm)/Al (1.2 nm)-oxide/$Co_{75}Fe_{25}$ (3 nm)/IrMn (15 nm)/Ta (60 nm) and microfabricated using electron beam lithography and Ar ion etching with a $10^2$ μm$^2$ junction area, where $Co_2$YZ stands for $Co_2(Cr_{1-x}Fe_x)Al$ or $Co_2FeSi$. The tunnel barriers were formed by the deposition of 1.2 nm Al, followed by plasma oxidization in the chamber. The x-ray diffraction revealed the A2 or B2 structure depending on heat treatment conditions and the substrate, but not $L2_1$ structure for the $Co_2(Cr_{1-x}Fe_x)Al$ (0≤x≤1) films. The $L2_1$ structure, however, was obtained for the $Co_2FeSi$ films when deposited on a MgO (001) substrate at elevated temperatures above 473 K. The maximum tunneling magnetoresistance (TMR) was obtained with 52% at RT and 83% at 5 K for a junction using a $Co_2(Cr_{0.4}Fe_{0.6})Al$ electrode. While the junction using a $Co_2FeSi$ electrode with the $L2_1$ structure exhibited the TMR of 41% at RT and 60% at 5 K, which may be improved by using a buffer layer for reducing the lattice misfit between the $Co_2FeSi$ and MgO (001) substrate.

In an embodiment of the present technology, referring still to FIG. 1, the pinning layer 22 is selected from the group of materials consisting of: iridium manganese chromium (IrMnCr); iridium manganese (IrMn); nickel manganese (NiMn); nickel manganese chromium (NiMnCr); nickel manganese iron (NiMnFe); nickel manganese iridium (NiMnIr); nickel manganese palladium (NiMnPd); nickel manganese platinum (NiMnPt); nickel manganese rhodium (NiMnRh); platinum-manganese (PtMn), and nickel manganese ruthenium (NiMnRu).

Example IV

In the paper "Magnetic Tunnel Junction Materials for Electronic Applications" by J. M. Slaughter et al., published in *JOM-e*, 52 (6) (2000), http://www.tms.org/pubs/journals/JOM/0006/Slaughter/Slaughter-0006.html, a ferromagnetic thin film is pinned when placed in contact with an antiferromagnetic (AF) thin film due to exchange coupling. For an uncoupled, free, ferromagnetic film, the magnetic orientation of the film displays a hysteretic behavior pointing in the direction of the last applied saturating field. If a saturating field is applied and then taken away, the magnetic orientation of this free film will be in the direction of that field. If the direction of the applied saturating field is reversed and again taken away, the magnetic orientation of the film will be reversed. Thus, in zero applied field, either orientation is possible. A ferromagnetic film pinned by an AF layer displays similar behavior, but has an offset. In zero field, the ferromagnetic film will align in one direction. An exchange coupling between the ferromagnetic and AF layers, at their mutual interface, causes the ferromagnetic layer to be preferentially aligned in one direction. For the memory devices in question, this preferential alignment or pinning is used to lock one layer in a fixed direction. Much of this work on AF pinning materials, and of others in the field, has revolved around manganese-based antiferromagnetic materials such as Pt—Mn, Ir—Mn, Rh—Mn, and Fe—Mn. Pt—Mn was a particularly interesting pinning material because it remained antiferromagnetic at relatively high temperatures. Unlike many of the commonly used AF alloys, as-deposited Pt—Mn is not AF. Instead, this material must be post annealed, resulting in a phase transformation from face-centered cubic (f.c.c.) to a face-centered tetragonal (f.c.t.) crystal structure. The f.c.t. phase of Pt—Mn is AF and will pin an adjacent ferromagnetic film. The pinning strength increases with annealing time. The shift and broadening of the Ni—Fe hysteresis loop in the annealed material is characteristic of a pinned ferromagnetic film. Once pinned, the exchange bias causes the magnetic orientation of the film to be in one direction at zero applied field.

In an embodiment of the present technology, referring still to FIG. 1, the pinning layer 22 further comprises a Ruderman-Kittel-Kasuya-Yosida (RUDERMAN-KITTEL-KASUYA-YOSIDA (RKKY)) non-magnetic pinning layer.

Figure 2:
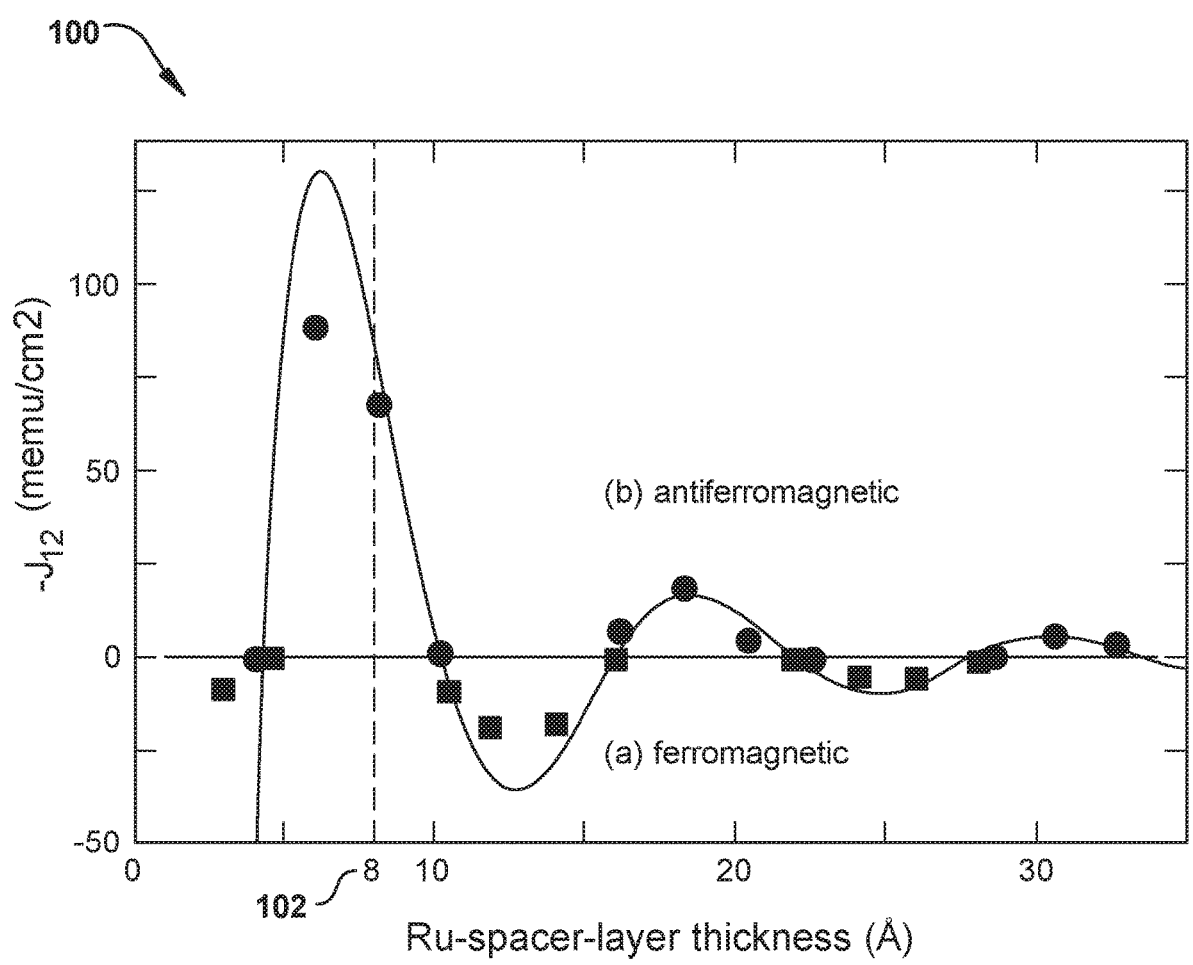
FIG. 2 illustrates the dependence of the RUDERMAN-KITTEL-KASUYA-YOSIDA (RKKY) interaction on the spacing layer thickness for Ruthenium (Ru) for the purposes of the present technology.

As it is illustrated in FIG. 2, the RKKY interaction 100 exhibits the antiferromagnetic polarity for a Ruthenium spacer having the layer thickness at about 8 Å(102). For the reference, please see S. S. P. Parkin, "Spin Engineering: *Direct determination of the Ruderman-Kittel-Kasuya-Yosida far field function in ruthenium*", Phys. Rev B 44 (13), 1991.

In an embodiment of the present technology, using a Ru spacer as a pinning layer (22 of FIG. 1) with thickness of about 8 Å we can orient the magnetization of spin injector 20 antiparallel to the magnetization of the bottom layer 16 which would allow to inject the maximum minority current into the bottom layer 16 comprising the Magnon Gain Medium. The injection of maximum minority current would substantially simplify reaching the magnon lazing point. Please, see the discussion below.

In an embodiment of the present technology, referring still to FIG. 1, the reference layer 24 comprises a ferromagnetic material that is used to select the orient of the bottom layer 16 in a certain direction.

In an embodiment of the present technology, the reference (or free) layer can be implemented by using CFA (B2-ordered Co2FeAl). For the reference, please see: Hiroaki Sukegawa, Zhenchao Wen, Kouta Kondou, Shinya Kasai, Seiji Mitani, and Koichiro Inomata; Applied Physics Letters 100, 182403 (2012); "*Spin-transfer switching in full-Heusler $Co_2FeAl$-based magnetic tunnel junctions*".

In an embodiment of the present technology, referring still to FIG. 1, the top electrode 28 is selected from the group of materials consisting of: cobalt iron alloy (Co0.5 Fe 0.5); silver (Ag); gold (Au); platinum (Pt); cobalt (Co); palladium (Pd); titanium (Ti); and titanium tungsten (TiW). Each of these materials can be deposited by either MBE or sputtering.

In an embodiment of the present technology, referring still to FIG. 1, both spin injector 20 and pinning layer 22 are replaced by a single layer of electron injector. In this embodiment, the electron injector is selected from the group of materials consisting of: a metal; a metal alloy; a ferromagnetic metal; and a ferromagnetic alloy.

In an embodiment of the present technology, the terahertz magnon laser 10 (of FIG. 1) generates terahertz radiation based on magnon laser effect. For the reference, please see U.S. Pat. Nos. 7,430,074; 7,508,578; 9,136,665.

The essence of the terahertz radiation based on magnon laser effect is as follows. The Magnon Gain Medium (MGM) comprises a conduction band that is split into two sub bands separated by an exchange energy gap, a first sub band having spin up, and a second sub band having spin down (not shown).

In the case of conventional lasing, if an atom is already in the excited state (that is, there is population inversion, it may be perturbed by the passage of a photon that has a frequency $v_{21}$ corresponding to the energy gap $\Delta E$ of the excited state L2 to ground state L1 (Level 1) transition. In this case, the excited atom relaxes to the ground state, and is induced to produce a second photon of frequency $v_{21}$. The original photon is not absorbed by the atom, and so the result is two photons of the same frequency. This process is known as stimulated emission. The critical detail of stimulated emission is that the induced photon has the same frequency and phase as the incident photon. In other words, the two photons are coherent. It is this property that allows optical amplification, and the production of a laser system.

The magnon lasing process (I. Ya. Korenblit and B. G. Tankhilevich, *High frequency magnon generation by non-equilibrium electrons and stability of the magnon state*, Phys. Lett. A, 64, 307 (1977)) can be implemented in ferromagnets with an exchange gap, $\Delta$, in the electron spectrum, namely, in ferromagnetic semiconductors and half metals.

Figure 3:
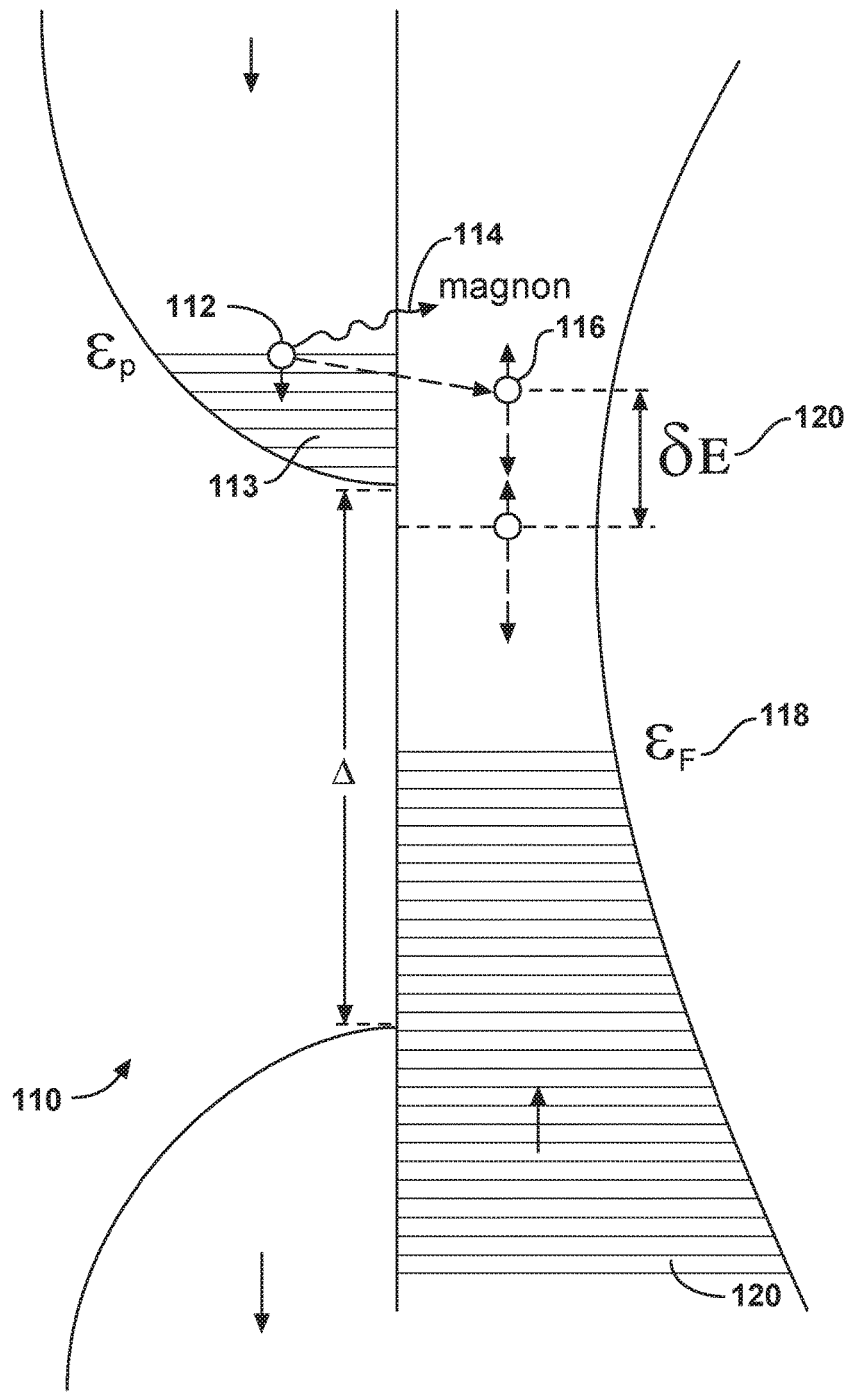
FIG. 3 shows the electron spectrum and generation of non-equilibrium magnons in half-metals for the purposes of the present technology.

FIG. 3 illustrates the magnon lasing in half-metals (110). A minority electron 112 injected into sub band with spin down 113 passes into a high-energy state 116 in the sub band with spin up 120 by emitting a magnon 114 (at the time about $10^{-12}$ sec) and after that rapidly loses its energy by relaxing on the equilibrium electrons at Fermi level 118 (at the time about $10^{-13}$ sec) before reabsorbing the same magnon. As a result, the electron strongly reduces its energy by the amount of δE 120 and cannot, therefore, return back into the sub-band with spin down by re-absorbing a magnon.

The number of nonequilibrium magnons depends on the ratio of magnon-electron damping rate $\Gamma_e$ to the magnon-magnon damping rate $\Gamma_m$ and reaches its max at the Max birth rate $\Gamma_e$ and Min death rate $\Gamma_m$. This corresponds to the biggest population of non-equilibrium magnons. The lasing frequency corresponds to the minimum magnon wave vector $q=(p_0-p)/\hbar$ because the magnon-electron damping $\Gamma_e$ is proportional to $q^{-1}$; and the magnon-magnon damping $\Gamma_m$ is proportional to $q^4$ so that $\Gamma_e/\Gamma_m$ is proportional to $q^{-5}$. Relaxation of non-equilibrium magnons on the borders of a sample happens many times before non-equilibrium magnon will scatter on equilibrium magnon. But these border processes are irrelevant as they are elastic and do not change the energy of magnons, whereas the change of momentum in isotropic system is not important. Thus, for magnon laser the minimum magnon wave vector $q=(p_0-p)/\hbar$ determines the lasing frequency:

$$\omega_{lasing}(q_{lasing})=D(p_0-p)/\hbar^2, \quad (Eq. 1)$$

where D is magnon stiffness.

Merging of two magnons with frequency f and almost equal antiparallel wave vectors (q/|q| and (−) q/|q|) generates a photon with frequency 2f. This process is a reversal of a well-known process of parametric magnon generation by electromagnetic radiation. It is easy to see that the desired pairs of magnons having orientations of their momentum vectors (q/|q| and (−) q/|q|) respectively are always generated by the electron current. Indeed, the Fermi velocities of the electrons in the current are directed randomly in all directions, since the drift velocity is very small comparatively to the Fermi velocity. Hence, among the injected electrons there are always two electrons with equal but antiparallel momentums. It follows from the energy and momentum conservation laws that such electrons generate two magnons with equal and antiparallel wave vectors, the angle between vector (+) p/|p| and vector q/|q| being: cos (p, q)=$(\hbar q)^2-p^2_0)/2pq\hbar$ It follows from this relationship that for magnons with |q| close to the lasing momentum $q_1$ is almost antiparallel to vector p. At a critical pumping current density j=$10^4$-$10^6$ A/cm² (the required critical pumping is of the same order of magnitude as required in the case of the conventional semiconductor laser), the magnon lasing process begins, and the device should generate high-power narrow-frequency THz radiation.

Example V

The Estimation of the Lasing Frequency of the THz Radiation in Co₂MnSi (001)/MgO Heterostructures
The stiffness D=466 meV(Å)² (according to Ritchie L. et al., *Phys. Rev. B* 68, 104430) or 567 meV(Å)² (according to Jan Thoene, Stanislav Chadov, Gerhard Fecher, Claudia Felser, Jurgen Kubler) *J. Phys. D: Appl. Phys.* 42 (2009) 084013)).
The Energy gap Δ=0.6 eV (Bjorn Hulsen and Matthias Scheffler; *Phys. Rev Let.* 103, 046802 (2009).)
The Effective electron mass $m_{eff}$=(1.15-1.67) $m_0$ (Steffen Kaltenborn and Hans Christian Schneider, *Phys. Rev B* 88, 045124 (23013).

The Energy of THz is double of min frequency of the non-equilibrium magnon (at magnon lazing point)

$\hbar f_{THz}=2D(q_1)^2 \Rightarrow$ For $D=466$ meV(Å)²$\Rightarrow f=(10.76-13.63)$ THz>;

For $D=567$ meV(Å)²$\Rightarrow f=(13.10-20.24)$ THz

For the magnon laser to operate effectively at room temperatures it is paramount to have the maximum possible polarization such that the majority electrons with spin up located in the sub band with spin up are the only electrons present in the half-metal in the equilibrium state. Researchers in Johannes Gutenberg University of Mainz directly observed at room temperature the 100-percent spin polarization of a Heusler compound Co2MnSi (CMS) having a high Curie temperature of 985 K.

To develop a practical Terahertz magnon laser operational at room temperatures, we need to accomplish at least two things: (a) to inject minority electrons with spin down into the upper sub-band of the half metal, and (b) to inject a threshold critical minority electron current density into upper sub-band to achieve the start of magnon lasing process.

Figure 4:
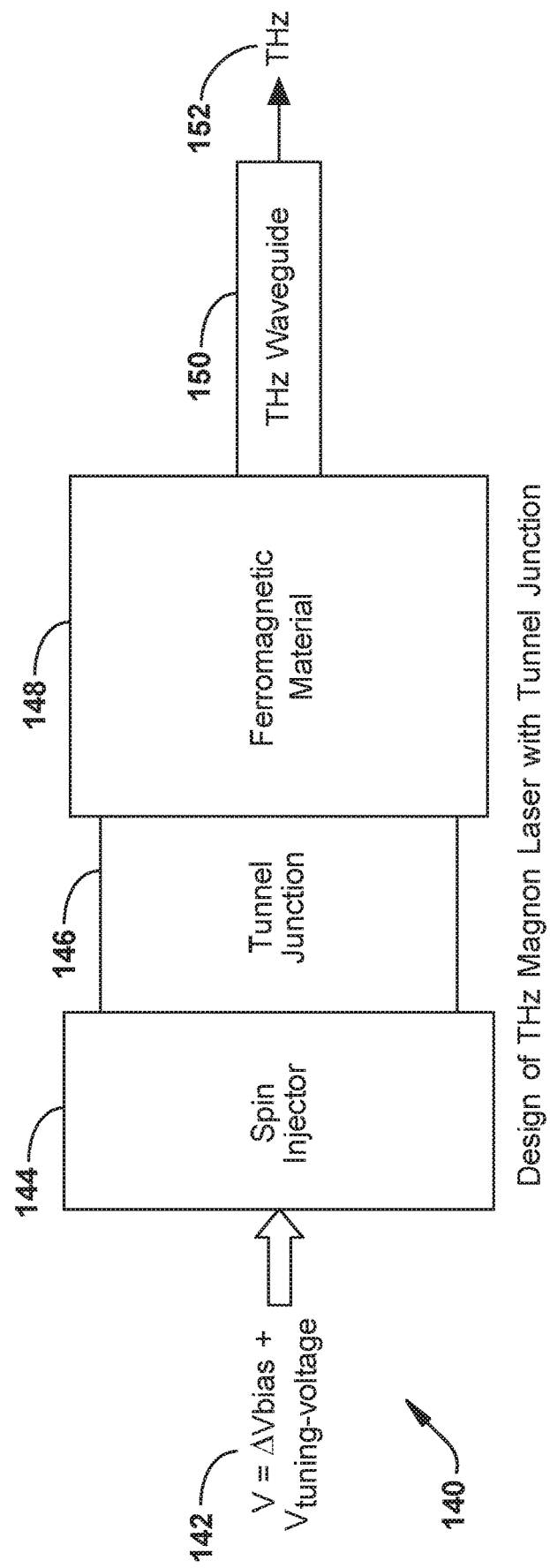
FIG. 4 depicts design of a tunable terahertz magnon laser with tunnel junction for the purposes of the present technology.

In an embodiment of the present technology, FIG. 4 depicts the general design of voltage-based tunable terahertz magnon laser 140 comprising the spin injector 144, the tunnel junction 146, the ferromagnetic material 148 including the Manon Gain Medium, and the THz waveguide 150. The THz waveguide can be implemented by using the 3D printing techniques.

Figure 5:
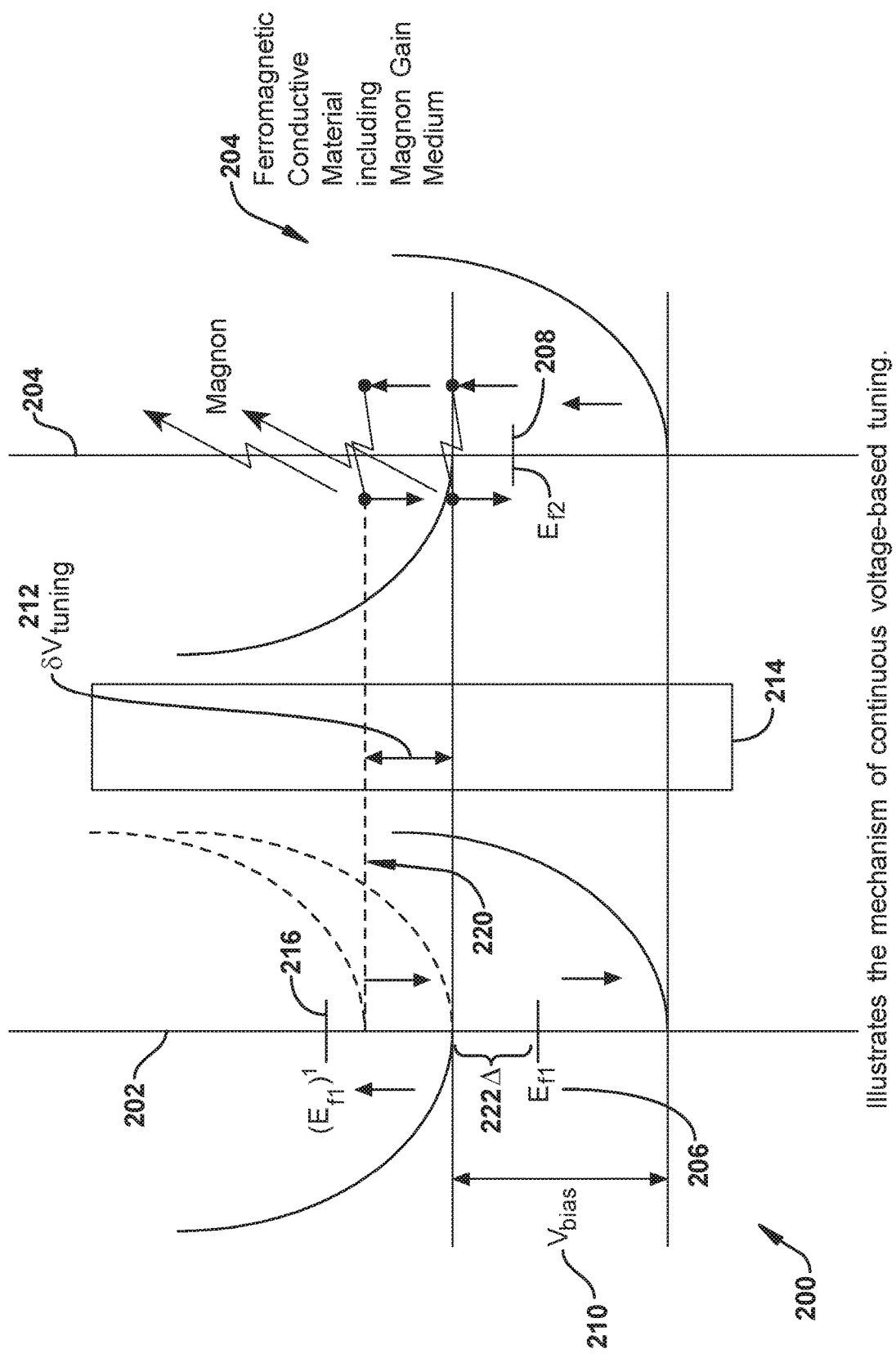
FIG. 5 illustrates the mechanism of continuous voltage-based tuning of a tunable terahertz magnon laser with tunnel junction of FIG. 4 for the purposes of the present technology.

In an embodiment of the present technology, FIG. 5 illustrates the mechanism 200 of continuous voltage-based tuning of the magnon laser 140 of FIG. 4.

In general, increase of voltage bias 210 causes increase of minority current by increasing the minority carriers in the sub band with spin down 202 (having Fermi level $E_{f1}$ 216). $E_{f1}$ 216). Indeed, the tunneling of minority electron 220 with max energy via the tunnel junction 214 has the highest probability to propagate into the sub band with spin up 204 (having Fermi level $E_{f2}$ 208) by flipping its spin and to generate magnons with the smallest possible magnon lasing wave vector $q=(p_0-p_{\varepsilon max})/\hbar$ that corresponds to the momentum of electron that tunnel with the max energy $\varepsilon_{max}$.

The further increase of bias after the lasing point is reached causes further increase of the max energy and momentum of electrons with the highest tunneling probability which causes further decrease of magnon lasing wave vector and further corresponding decrease of THz frequency.

More specifically, the tuning in this system can be achieved by changing the bias voltage $eV_{bias}$ 210=(D+$\varepsilon_p$) by dV. It will result in changing the lasing frequency (tuning) by df:

$$(df/f)=-(dV/V)(\Delta/\varepsilon_p)^{1/2} \quad (Eq. 2)$$

Thus, the tuning of lasing frequency is parametrically larger than the shift in bias voltage because small changes in bias result in large changes in the electron energy and therefore in large changes in lasing frequency. Thus, we can cover the whole THz band in the range of (1-30) THz by using voltage-based tuning.

Example VI

For $\Delta/\varepsilon_p \approx 10^2$; if dV/V≈1%$\Rightarrow$df/f≈10%, so we can cover the THz frequency region between $f_{max}$ and $0.9f_{max}$ just by changing the tuning voltage by just 1%.

So, effectively we have a Micro-Synchrotron on a chip. Indeed, the parametrically large $(\Delta/\varepsilon_p)^{1/2}$ frequency range (from THz max down to THz min) and High Output Power makes the THz Magnon laser device effectively a Micro-Synchrotron on a chip because we can continuously cover substantial range of lasing frequencies by using just one chip-size device.

In an embodiment of the present technology, a method for tuning the frequency of THz radiation is provided. The method utilizes the apparatus of FIG. 4 comprising the spin injector 144, the tunnel junction 146 coupled to the spin injector, and the ferromagnetic material 148 coupled to the tunnel junction 146. The ferromagnetic material comprises the Magnon Gain Medium (MGM).

The method for tuning the frequency of THz radiation comprises the step of applying a bias voltage 142 to shift a Fermi level of the spin injector 144 with respect to a Fermi level of the ferromagnetic material 148 to initiate generation of non-equilibrium magnons by injecting minority electrons into the Magnon Gain Medium.

An injected minority electron passes into high energy electronic states in a lower sub band with spin up of the ferromagnetic material by flipping its spin during exchange process. During this process a non-equilibrium magnon is generated. The interaction between the generated non-equilibrium magnons causes generation of the THz electromagnetic radiation.

The method further comprises the step of tuning a frequency of the generated THz radiation by changing the value of the bias voltage 142.

The above discussion has set forth the operation of various exemplary systems and devices, as well as various embodiments pertaining to exemplary methods of operating such systems and devices. In various embodiments, one or more steps of a method of implementation (calculating the optimum voltage bias, for example) are carried out by a processor under the control of computer-readable and computer-executable instructions. Thus, in some embodiments, these methods are implemented via a computer.

In an embodiment, the computer-readable and computer-executable instructions may reside on computer useable/readable media.

Therefore, one or more operations of various embodiments may be controlled or implemented using computer-executable instructions, such as program modules, being executed by a computer. Generally, program modules include routines, programs, objects, components, data structures, etc., that perform particular tasks or implement particular abstract data types. In addition, the present technology may also be practiced in distributed computing environments where tasks are performed by remote processing devices that are linked through a communications network. In a distributed computing environment, program modules may be located in both local and remote computer-storage media including memory-storage devices.

Although specific steps of exemplary methods of implementation are disclosed herein, these steps are examples of steps that may be performed in accordance with various exemplary embodiments. That is, embodiments disclosed herein are well suited to performing various other steps or variations of the steps recited. Moreover, the steps disclosed herein may be performed in an order different than presented, and not all of the steps are necessarily performed in a particular embodiment.

Although various electronic and software based systems are discussed herein, these systems are merely examples of environments that might be utilized, and are not intended to suggest any limitation as to the scope of use or functionality of the present technology. Neither should such systems be interpreted as having any dependency or relation to any one or combination of components or functions illustrated in the disclosed examples.

Although the subject matter has been described in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. An apparatus comprising:
   a top electrode;
   a reference layer coupled to said top electrode;
   a RUDERMAN-KITTEL-KASUYA-YOSIDA (RKKY) pinning layer coupled to said reference layer;
   an electron injector coupled to said (RKKY) pinning layer;
   a tunnel junction coupled to said electron injector;
   a bottom layer further comprising a ferromagnetic material coupled to said tunnel junction;
   a bottom electrode coupled to said bottom layer; and
   a substrate coupled to said bottom electrode;
   wherein said ferromagnetic material includes a Magnon Gain Medium; said ferromagnetic material further comprising:
   a conduction band that is split into two sub bands separated by an exchange energy gap, a first sub band having spin up directed along the magnetization of said ferromagnetic material; and a second sub band having spin down directed opposite to the magnetization of said ferromagnetic material; and
   wherein a thickness of said RUDERMAN-KITTEL-KASUYA-YOSIDA (RKKY) pinning layer is selected to provide an antiferromagnetic interaction between said reference layer and said electron injector; and
   wherein an electric bias voltage applied across said apparatus between said top electrode and said bottom electrode is configured to inject a minority current from said electron injector to said Magnon Gain Medium via said tunnel junction; and
   wherein said applied bias voltage is configured to shift the Fermi level of said electron injector with respect to the Fermi level of said ferromagnetic material; and
   wherein said minority current propagating via said Magnon Gain Medium causes the generation of non-equilibrium magnons in said Magnon Gain Medium; and wherein merging of said non-equilibrium magnons causes generation of terahertz radiation emanating from said apparatus into the surrounding area.

2. The apparatus of claim 1, wherein said ferromagnetic material including said Magnon Gain Medium is selected from the group consisting of: a ferromagnetic semiconductor;
   a dilute magnetic semiconductor (DMS); a half-metallic ferromagnet (HMF); and a ferromagnetic conductor, with a gap in the density of states of the minority electrons around the Fermi level of said ferromagnetic material.

3. The apparatus of claim 2, wherein said half-metallic ferromagnet (HMF) is selected from the group consisting of:
   a spin-polarized Heusler alloy; a spin-polarized colossal magnetoresistance material; and $CrO_2$.

4. The apparatus of claim 3; wherein said spin polarized Heusler alloy is selected from the group consisting of:

half-metallic ferromagnetic oxide $Sr_2FeMoO_6$; Heusler alloy $Co_2MnGe$; Heusler alloy $Co_2MnSi$ (CMS); Heusler alloy $Co_2FeSi$ (CFS); Heusler alloy $Co_2MnSn$; and Heusler alloy $Co_2FeAl_{0.5}Si_{0.5}$(CFAS).

5. The apparatus of claim 1; wherein said top electrode is selected from the group of materials consisting of:
cobalt iron alloy ($Co_{0.5}$ $Fe_{0.5}$); silver (Ag); gold (Au); platinum (Pt); cobalt (Co);
palladium (Pd); titanium (Ti); and titanium tungsten (TiW).

6. The apparatus of claim 1; wherein said reference layer is implemented by using CFA (B2-ordered $Co_2FeAl$).

7. The apparatus of claim 1; wherein said RKKY pinning layer includes Ruthenium (Ru) pinning layer.

8. The apparatus of claim 1, wherein said electron injector is selected from the group of materials consisting of: a metal; a metal alloy; a ferromagnetic metal; and a ferromagnetic alloy.

9. The apparatus of claim 1; wherein said tunnel junction is selected from the group of materials consisting of:
magnesium oxide (MgO); aluminum oxide ($Al_2O_3$); and spinel $MgAl_2O_4$.

10. The apparatus of claim 1; wherein said bottom electrode is selected from the group of materials consisting of:
cobalt iron alloy ($Co_{0.5}$ $Fe_{0.5}$); silver (Ag); gold (Au); platinum (Pt); cobalt (Co); palladium (Pd);
titanium (Ti); and titanium tungsten (TiW).

11. The apparatus of claim 1; wherein said substrate is selected from the group of materials consisting of:
gallium arsenide (GaAs); aluminum oxide ($Al_2O_3$); aluminum nitride; indium-tin-oxide (InTnO);
silicon (Si); silicone on sapphire (SoS); and magnesium oxide (MgO).

12. The apparatus of claim 1, wherein minority electrons injected into said upper sub band with spin down via said tunnel junction generate non-equilibrium magnons by transitioning into high energy electronic states in said lower sub band with spin up; and wherein interaction between said non-equilibrium magnons causes generation of electromagnetic radiation; said apparatus further comprising:
an electromagnetic waveguide coupled to said ferromagnetic material and configured to output said electromagnetic radiation.

13. The apparatus of claim 1, wherein minority electrons injected into said upper sub band with spin down via said tunnel junction generate non-equilibrium magnons by transitioning into high energy electronic states in said lower sub band with spin up; and wherein interaction between said non-equilibrium magnons causes generation of THz electromagnetic radiation; said apparatus further comprising:
a THz electromagnetic waveguide coupled to said ferromagnetic material and configured to output said THz electromagnetic radiation.

14. A method for tuning the frequency of radiation by using an apparatus comprising a top electrode, a reference layer, an RKKY pinning layer, an electron injector, a tunnel junction, a bottom layer comprising a Magnon Gain Medium, a bottom electrode, a substrate; and an electromagnetic waveguide; said method comprising:
(A) selecting thickness of said RKKY layer to implement an antiferromagnetic interaction between said reference layer and said electron injector;
(B) applying a bias voltage to shift a Fermi level of said electron injector with respect to a Fermi level of said Magnon Gain Medium to initiate generation of non-equilibrium magnons by injecting minority electrons into said Magnon Gain Medium; wherein injected minority electrons pass into high energy electronic states in a lower sub band with spin up of said ferromagnetic material by flipping their spin during exchange process; and wherein non-equilibrium magnons are generated during said process; and wherein interaction between said non-equilibrium magnons causes generation of said electromagnetic radiation; and
(C) outputting said electromagnetic radiation by using an electromagnetic waveguide coupled to said ferromagnetic material.

15. The method of claim 14; wherein said step (C) further comprises:
(C1) outputting generated electromagnetic radiation further comprising outputting THz radiation by using a THz electromagnetic waveguide coupled to said ferromagnetic material.

16. The method of claim 14; wherein said step (B) further comprises:
(B1) increasing value of said bias voltage; wherein injected minority electrons having increased energy due to increased value of said bias voltage have higher probability to transition into high energy electronic states in said lower sub band with spin up of said ferromagnetic material by flipping its spin during exchange process; and wherein the decrease of an energy of the non-equilibrium magnon caused by increased energy of injected minority electrons causes the corresponding decrease of a frequency of said generated radiation.

17. The method of claim 14; wherein said step (B) further comprises:
(B2) reaching the lasing frequency by increasing value of said bias voltage.

18. The method of claim 14 further comprising:
(D) tuning frequency of said generated radiation by changing the value of said bias voltage.

19. The method of claim 18, wherein said step (D) further comprises:
(D1) reaching a lasing frequency of said generated radiation by changing the value of said bias voltage.

20. The method of claim 18, wherein said step (D) further comprises:
(D2) tuning frequency of said generated radiation by changing the value of said bias voltage;
wherein the tuning of said frequency is parametrically larger than the change in said bias voltage.

* * * * *